(12) United States Patent
Wang et al.

(10) Patent No.: US 8,681,029 B1
(45) Date of Patent: Mar. 25, 2014

(54) CHOPPER-STABILIZATION METHOD AND APPARATUS FOR SIGMA DELTA MODULATORS

(71) Applicant: Invensense, Inc., Sunnyvale, CA (US)

(72) Inventors: Stanley Bo-Ting Wang, Cupertino, CA (US); Derek K. Shaeffer, Redwood City, CA (US)

(73) Assignee: Invensense, Inc., San Jose, CA (US)

( * ) Notice: Subject to any disclaimer, the term of this patent is extended or adjusted under 35 U.S.C. 154(b) by 2736 days.

(21) Appl. No.: 13/624,802

(22) Filed: Sep. 21, 2012

(51) Int. Cl.
*H03M 3/00* (2006.01)

(52) U.S. Cl.
USPC .......................................... 341/143; 341/118

(58) Field of Classification Search
USPC .......................................................... 341/143
See application file for complete search history.

(56) References Cited

U.S. PATENT DOCUMENTS

| | | | |
|---|---|---|---|
| 4,939,516 A | * | 7/1990 | Early ............................ 341/143 |
| 5,039,989 A | * | 8/1991 | Welland et al. ................ 341/143 |
| 5,459,432 A | * | 10/1995 | White et al. ................... 329/307 |
| 7,391,351 B2 | * | 6/2008 | Pertijs et al. .................. 341/143 |
| RE41,830 E | * | 10/2010 | Chuang ......................... 341/143 |

OTHER PUBLICATIONS

R. Schreier and G. C. Temes, "Understanding Delta-Sigma Data Converters", John Wiley & Sons, Inc., New Jersey, 2005, pp. 4-13.
S. R. Norsworthy, R. Schreier and G. C. Temes, "Delta-Sigma Data Converters: Theory, Design, and Simulation", John Wiley & Sons, Inc., New Jersey, 1997, pp. 333-378.
M. Ortmanns and F. Gerfers, "Continuous-Time Sigma-Delta A/D Conversion: Fundamentals, Performance Limits and Robust Implementations", Springer Berlin Heidelberg, 2006, pp. 39-84.
Bernhard E. Boser and Bruce A Wooley, "The Design of Sigma-Delta Modulation Analog-to-Digital Converters", IEEE Journal of Solid-State Circuits, vol. 23, No. 6, Dec. 1988, pp. 1298-1307.

* cited by examiner

*Primary Examiner* — Khai M Nguyen
(74) *Attorney, Agent, or Firm* — Maryam Imam; IPXLAW Group LLP

(57) ABSTRACT

An embodiment of the invention includes an analog to digital converter including a sigma delta modulator that generates a feedback signal. The sigma delta modulator includes a quantizer responsive to an input signal and the feedback signal and generates a quantizer output. The sigma delta modulator further includes a chopper-stabilized amplifier that provides a reference signal to the sigma delta modulator, and the chopper-stabilized amplifier is stabilized according to a combination of a chopping signal and the quantizer output.

37 Claims, 6 Drawing Sheets

CHOPPER-STABILIZATION METHOD AND APPARATUS FOR SIGMA DELTA MODULATORS

BACKGROUND

Various embodiment of the invention relate generally to modulators and particularly to sigma delta modulators.

High-resolution analog to digital converters typically include a modulator, with the modulator, in some cases, being a sigma delta type of modulator. The reference buffer is generally a part of the feedback path (or circuit) of the sigma delta modulator. For example, a single-loop sigma-delta modulator generally includes a loop filter, a 1-bit quantizer, and a feedback circuit, where the feedback circuit has a reference buffer, an optional single-ended to differential converter, and a multiplexer. An analog input signal, "IN", serves as the input to the modulator, a feedback signal, "FB", serves as the feedback signal to the modulator, and the output of the modulator, "OUT", serves as the 1-bit digital modulator output signal. The bandwidth of interest is referred to herein as "BW".

Depending on the polarity of "OUT" (1 or −1), either voltage "+Vref_buf" or "−Vref_buf", which are a part of the feedback circuit, is fed back to the loop filter, as one of the loop filter's input, "FB", through the multiplexer.

The reference buffer typically includes an amplifier, an input chopper-stabilization switch, and an output chopper-stabilization switch. "$V_{ref\_in}$" serves as the input signal and "$V_{ref\_out}$" serves as the output signal of the reference buffer. The chopper-stabilization switches are toggled by a chopping signal, such as "clk_sq", which is generally a square wave sequence ($\Gamma[k]$ with "k" as an integer) running at frequency $f_{chop}$. In general, frequency $f_{chop}$ is high enough (>BW) such that when "clk_sq" up-converts the offset ($V_{offset}$) and low-frequency (flicker) noise of the reference buffer to frequency $f_{chop}$ and its harmonic, the up-converted offset and flicker noise is out-of-band and no longer degrades the in-band (<BW) signal-to-noise ratio (SNR). However, the sigma-delta modulator output, "OUT[k]" with "k" as an integer, includes quantization noise with its magnitude increasing with frequency. When OUT[k] controls the feedback switch to send either "+$V_{ref\_buf}$" or "−$V_{ref\_buf}$" to signal "FB", a mixing process occurs, and during the mixing process, low-frequency noise is undesirably generated from down-conversion of the quantization noise from OUT[k]. This low-frequency noise in signal "FB" is then fed back to the input and is passed to the output of the modulator, which degrades signal-to-noise ratio (SNR) of the output signal.

This is perhaps best understood by showing, mathematically, the effect on FB, as follows:

$$FB = OUT[k] \times V_{ref\_buf} \quad \text{Eq. (1)}$$

$$= OUT[k] \times (V_{ref\_in} + V_{offset} \times \Gamma[k]) \quad \text{Eq. (2)}$$

$$= OUT[k] \times V_{ref\_in} + V_{offset} \times \Gamma[k] \times OUT[k] \quad \text{Eq. (3)}$$

$$= FB_{ideal} + FB_{non-ideal} \quad \text{Eq. (4)}$$

$$FB_{ideal} = OUT[k] \times V_{ref\_in} \quad \text{Eq. (5)}$$

$$FB_{non-ideal} = V_{offset} \times \Gamma[k] \times OUT[k] \quad \text{Eq. (6)}$$

$FB_{non-ideal}$ is the undesired mixing product of OUT[k] and chopping signal sequence $\Gamma[k]$, and it contains low-frequency noise generated from down-conversion of the quantization noise from OUT[k] by $\Gamma[k]$. This low-frequency noise in signal "FB" is then fed back to the input and gets passed to the output, which degrades the SNR of the signal.

Conventionally, there are two ways to mitigate the quantization noise down-conversion, as follows:

1. Minimize $V_{offset}$. This requires larger device sizes for better random mismatch and careful layout for smaller systematic offset in the reference buffer. This leads to larger circuit area, which increases costs, and power consumption is increased.
2. Minimize $f_{chop}$. The smaller the $f_{chop}$, the smaller the quantization noise is to be down-converted. However, if $f_{chop}$ is too low, it would lead to ineffective chopper-stabilization, e.g. large residual in-band flicker noise.

Both approaches 1. and 2. above impose constraints on the design of a sigma delta modulator, and neither of them can successfully remove the quantization noise down-conversion completely.

Accordingly, there is a need for an analog to digital converter having a modulator with precise signal measurement for improving noise performance thereof while also reducing die size and power consumption.

SUMMARY

Briefly, an analog to digital converter is disclosed to include a sigma-delta modulator that generates a feedback signal. The sigma delta modulator includes a quantizer responsive to an input signal and the feedback signal and generates a quantizer output. The sigma delta modulator further includes a chopper-stabilized amplifier that provides a reference signal to the sigma delta modulator and the chopper-stabilized amplifier is stabilized according to a combination of a chopping signal and the quantizer output.

A further understanding of the nature and the advantages of particular embodiments disclosed herein may be realized by reference of the remaining portions of the specification and the attached drawings.

DETAILED DESCRIPTION OF EMBODIMENTS

Particular embodiments and methods of the invention disclose a stable, low power, and inexpensive analog to digital converter having a modulator with precise signal measurement for improving noise performance thereof. The modulator generates a feedback signal and includes a quantizer responsive to an input signal and the feedback signal and generates a quantizer output. The modulator further includes a chopper-stabilized amplifier that provides a reference signal to the modulator, and the chopper-stabilized amplifier is stabilized according to a combination of a chopping signal and the quantizer output.

The following description describes an analog to digital converter with a sigma delta modulator. The sigma delta modulator, with the use of a chopper-stabilized amplifier, exhibits improved stability, as discussed below.

Figure 1:
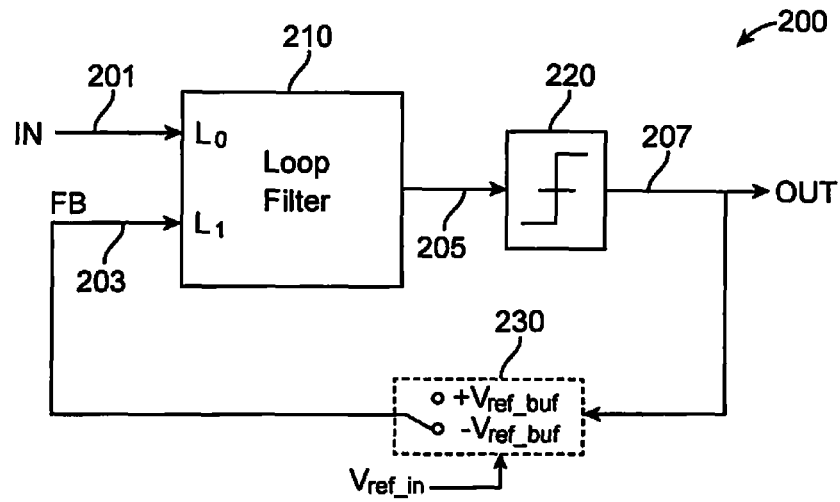
FIG. 1 shows an analog to digital converter 200, in accordance with an embodiment of the invention.

Referring now to FIG. 1, an analog to digital converter 200 is shown, in accordance with an embodiment of the invention. As known in the art, an analog to digital converter converts a signal that is in analog form to a signal that is in digital form. The converter 200 is shown to include a loop filter 210, a quantizer 220, and a feedback circuit 230. The loop filter 210, the quantizer 220, and the feedback circuit 230 are collectively referred to herein as a "single-loop sigma delta modulator" or "sigma delta modulator", with sigma delta being one of a number of types of modulators.

The loop filter 210 is shown to receive an input signal ("IN") 201 and a feedback signal ("FB") 203 as its inputs and to generate a loop filter output 205. The output 205 is shown as the input to the quantizer 220 and in this respect, the loop filter 210 and the quantizer 220 are coupled to each other. The quantizer 220 is shown to generate the output signal ("OUT") 207, which is effectively the output of the modulator 200. The signal 207 is shown to be an input to the feedback circuit 230 and the feedback circuit 230 is shown to generate the feedback signal 203. Further details of the feedback circuit 230 are shown in FIG. 1(a).

IN 201 is typically an analog signal whereas, OUT 207 is typically a digital signal. Accordingly, the modulator 200 effectively converts the analog signal, IN 201, to the digital signal, OUT 207. The feedback circuit 230 resides in the feedback path of the modulator 200 in that it utilizes the output of the modulator, OUT 207, to generate a signal, FB 203, for use by the forward path of the modulator 200, of which the loop filter 210 is a part. The quantizer 220 is also in the forward path of the modulator 200. As will be discussed in further detail shortly, the quantizer 220, in some embodiments, is a one-bit quantizer and in other embodiments, it is a multi-bit quantizer.

Figure 1A:
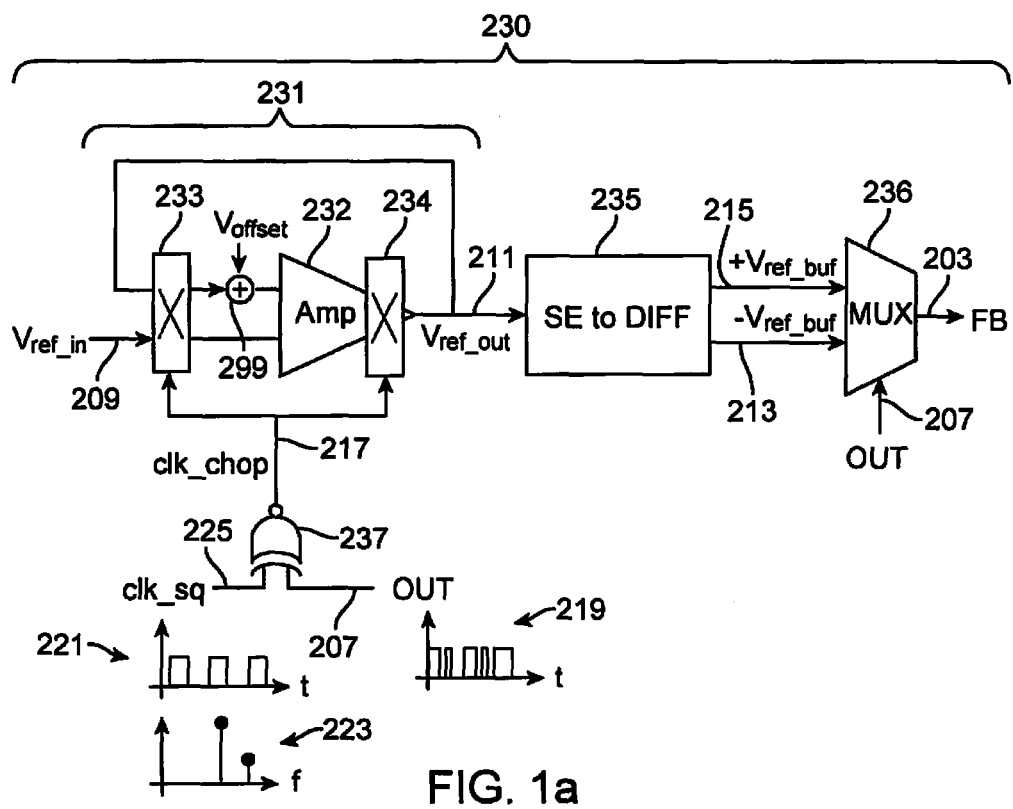
FIG. 1(a) shows further details of the feedback circuit 230 of FIG. 1.

FIG. 1(a) shows further details of the feedback circuit 230 of FIG. 1. In FIG. 1(a), the feedback circuit 230 is shown to include a reference buffer 231, a single-ended to differential ("SE to DIFF") converter 235, and a multiplexer ("mux") 236. As will be evident with respect to subsequent figures and discussion related thereto, in some embodiments, the converter 235 is optional.

The reference buffer 231 is shown to be coupled to the converter 235, which is shown coupled to the mux 236. The mux 236 is shown to generate FB 203. The reference buffer 231 is shown to generate $V_{ref\_out}$ 211 (also referred to herein as the "reference signal") and to provide the same as input to the converter 235 and it is shown to receive $V_{ref\_in}$ 209.

The input of the converter 235 is effectively the $V_{ref\_out}$ 211 and the output of the converter 235 is a differential one as the converter 235 converts a single-ended input into a differential output, $+V_{ref\_buf}$ 215 (also referred to herein as a "positive reference signal") and $-V_{ref\_buf}$ 213 (also referred to herein as a "negative reference signal").

The mux 236 receives as its inputs the $+V_{ref\_buf}$ 215 and $-V_{ref\_buf}$ 213 as well as the OUT 207 for selecting which of the inputs $+V_{ref\_buf}$ 215 and $-V_{ref\_buf}$ 213 to be the FB 203.

The reference buffer 231 is shown to include an input chopper-stabilization switch 233, an output chopper-stabilization switch 234, an amplifier 232, an adder 299, which is merely conceptual, and a combiner 237. The adder 299 together with $V_{offset}$ merely represents the input-referred offset from the amplifier 232 for the purpose of explaining the operation of the invention. In some embodiments, the combiner 237 is a multiplier, such as but not limited to, an exclusive OR or exclusive NOR circuit. The combiner 237, is shown to also receive inputs, a chopping signal ("clk_sq") 225 and the OUT 207.

The switch 233 is shown coupled to the adder 299 and the amplifier 232 and the amplifier 232 is shown coupled to the adder 299 and the switch 234. The chopper signal ("clk_chop") 217, which is generated by the combiner 237, is provided as input to each of the switches 233 and 234. The signal 217 is the combination of the signals 225 and OUT 207 and in some embodiments, it is the product of these signals. In the embodiment of FIG. 1(a), the combiner 237 is implemented as an exclusive NOR circuit.

Accordingly, each of the switches 233 and 234 switches as dictated by the signal 217. The output of the switch 233 is added to an input-referred voltage offset, $V_{offset}$, which is conceptual, and amplified by the amplifier 232 before it is provided to the switch 234.

The switches 233 and 234 are toggled by the signal 217, which is the output of the combiner 237. In some embodiments, the signal 225 is a square-wave signal, such as that which is conceptually shown at 221 and at 223 is shown the frequency spectrum, conceptually, of that of 221, in FIG. 1(a). OUT 207 is conceptually shown at 219. The signal 217, determinative of switching of each of the switches 233 and 234, advantageously removes part of the dependency of FB on OUT and therefore removes quantization down-conversion noise.

This is perhaps best illustrated by the following mathematical relationships in relation to FB 203:

$$FB = OUT[k] \times V_{ref\_buf} \quad \text{Eq. (7)}$$

$$= OUT[k] \times V_{ref\_in} + V_{offset} \times \Gamma[k] \times OUT[k]^2 \quad \text{Eq. (8)} =$$

$$= OUT[k] \times V_{ref\_in} + V_{offset} \times \Gamma[k] \quad \text{Eq. (9)}$$

$$= FB_{ideal} + FB_{non\text{-}ideal}$$

$$FB_{ideal} = OUT[k] \times V_{ref\_in} \quad \text{Eq. (10)}$$

$$FB_{non\text{-}ideal} = V_{offset} \times \Gamma[k] \quad \text{Eq. (11)}$$

The introduction of signal OUT[k] into the chopping signal causes a self-multiplication of OUT[k] when FB 203 is generated by mixing OUT[k], OUT 207, with "$V_{ref\_buf}$" ($+V_{ref\_buf}$ 215 and $-V_{ref\_buf}$ 213 in FIG. 1(a)). Because OUT[k] is a 1-bit sequence with value equal to "1" or "−1", the self-multiplication (OUT[k]$^2$) produces a constant "1", which then removes the dependency of $FB_{non\text{-}ideal}$, in Eq. (11) above, on OUT[k] and quantization down-conversion noise is advantageously removed. FB 203 is therefore solely comprised of the ideal feedback signal, $FB_{ideal}$, plus the up-converted reference buffer offset/noise to the vicinity of frequency $f_{chop}$ and its harmonics by Γ[k], which are generally out-of-band and will not degrade the SNR. The resulting time domain waveform of the output, OUT 207, is shown at 219 in FIG. 1(a). As is with the case of prior art techniques, in accordance with embodiments and methods of the invention, it is no longer a requirement to (a) increase reference buffer device size, (b) increase reference buffer power consumption, and/or (c) lower $f_{chop}$ and the overall performance and cost of the modulator 200 is accordingly improved.

The chopping sequence Γ[k] for the chopping signal, clk_sq 225, is not limited to a square wave. For example, Γ[k] can be a pseudo-random sequence for which in the frequency domain the in-band magnitude is small, such that $FB_{non-ideal}$ contains minimum in-band noise after $V_{offset}$ is chopped by Γ[k] as shown in Eq. (11). Other sequences with useful spectral properties may also be used. For example, a chopping sequence with noise shaping may redistribute the offset in frequency, spreading its energy away from a band of interest.

The reference buffer 231 and the combiner 237 are collectively referred to herein as the "chopper-stabilized amplifier".

Figure 2:
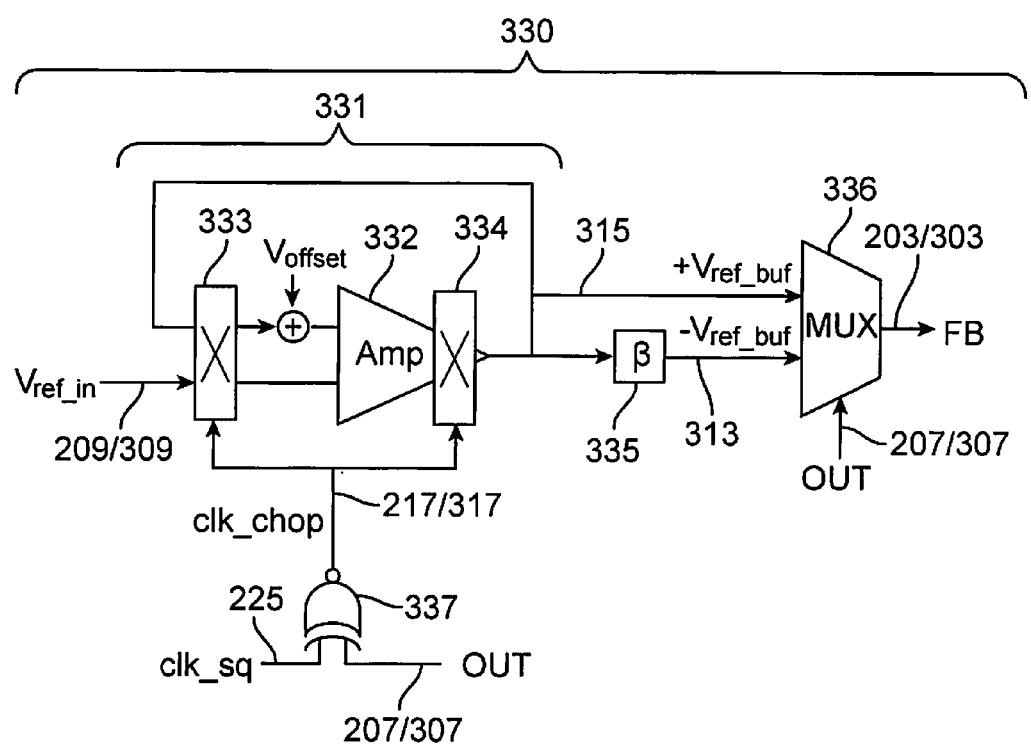
FIG. 2 shows a feedback circuit 330, in accordance with another embodiment of an analog to digital converter using the same in place of the feedback circuit 230.

FIG. 2 shows a feedback circuit 330, in accordance with another embodiment of an analog to digital converter using the same in place of the feedback circuit 230. The circuit 330 is analogous to the circuit 230 except that the former does not have the converter 235 and rather includes a scalar 335. That is, while the circuit 330 includes a reference buffer 331, such as the reference buffer 231 of FIG. 1(a), the output 315 of the reference buffer is shown to be an input to the scalar 335 and to the mux 336, which is analogous to the mux 236, as the input $+V_{ref\_buf}$ 315. The scalar 335 serves to scale the output of the reference buffer 331 by a predetermined factor β. Thus, $+V_{ref\_buf}$ 315, which is analogous to $+V_{ref\_buf}$ 215, is the direct output voltage from the reference buffer 331, and the $-V_{ref\_buf}$ 313 is generated by scaling the $+V_{ref\_buf}$ 315.

In other embodiments, rather than using the $+V_{ref\_buf}$ 315 and a scaled version thereof, the voltage difference between $+V_{ref\_buf}$ 315 and $-V_{ref\_buf}$ 313 can be used and conduct single-ended to differential conversion to generate the two voltage values used to generate FB 203/303. In this case, the converter 235 needs to be utilized. In still other embodiments, a combination of the scalar 335 and the converter 235 are used to scale one of the $V_{ref\_buf}$ and to use the difference between a scaled version thereof the opposite polarity thereof.

In yet other embodiment, the $+V_{ref\_buf}$ 315/215, $-V_{ref\_buf}$ 313/213, $V_{ref\_out}$ 211, $V_{ref\_in}$ 209/309, or FB 203/303, each, need not be voltage and can rather be in the form of current, charge, or any other types of signals contemplated by those in the art.

Figure 3:
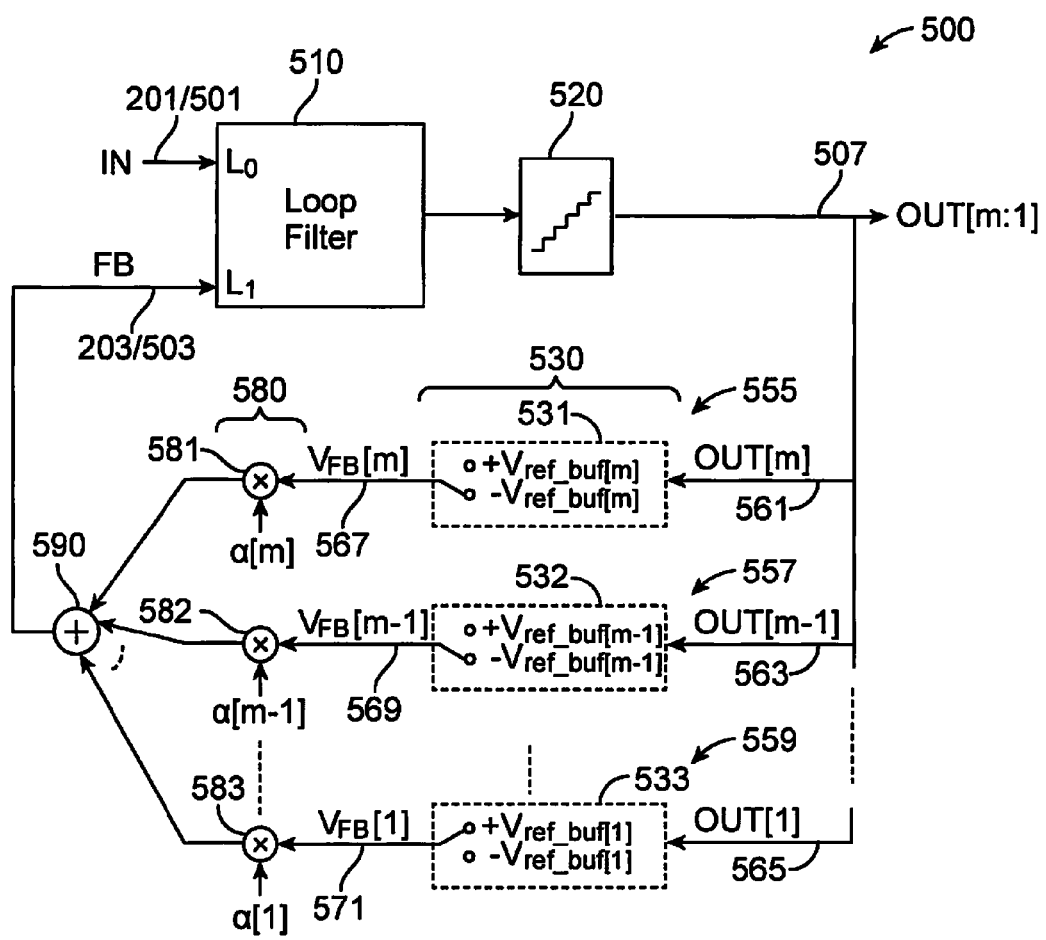
FIG. 3 shows an analog to digital converter 500, in accordance with another embodiment of the invention.

FIG. 3 shows an analog to digital converter 500, in accordance with another embodiment of the invention. The converter 500 of FIG. 3 is analogous to the converters of FIGS. 1 and 2, except that the quantizer of the former is a multi-bit quantizer, shown as the quantizer 520 in FIG. 3. The number of quantization bits is represented herein by "m" with "m" being an integer value. In FIG. 3, the loop filter 510, which is analogous to the loop filter 210, the quantizer 520, and the feedback path, made of the feedback circuit 530, multipliers 580, and an adder 590, comprise a sigma delta modulator.

Accordingly, "m" number of feedback circuits comprises the feedback circuit 530 of FIG. 3. In the exemplary embodiment of FIG. 3, feedback circuits 531, 532, 533, among others not shown, make up the feedback circuits of the circuit 530. To this end, the output of the modulator of FIG. 3, is an m-bit output, or OUT [m:1] 507 with each bit thereof being provided to a distinct feedback circuit of the feedback circuit 530. For example, the OUT[m] 561 is provided as input to the feedback circuit 531 and OUT [m−1] 563 is provided as input to the feedback circuit 532 and so on. Each of the feedback circuits of the circuit 530 is included in a stage that also comprises a multiplier. For example, the stage at 555, in FIG. 3, includes the feedback circuit 531 and a multiplier 581. The stage at 557, in FIG. 3, includes the feedback circuit 532 and a multiplier 582 and the stage at 559 includes the feedback circuit 533 and a multiplier 583.

It is understood that each of the feedback circuits 531, 532, and 533 may be made of any of the feedback circuits shown and described herein, such as the ones of FIGS. 1-2.

Each of the multipliers 581, 582, and 583 multiplies the output of a respective feedback circuit with a coefficient, α. For example, the multiplier 581 multiplies the output of the feedback circuit 531, $V_{FB[m]}$ 567 with the coefficient α[m] and the multiplier 582 multiplies the output of the feedback circuit 532, $V_{FB[m-1]}$ 569 with the coefficient α[m−1] and so on.

The multipliers 581, 582, and 583, along with all other multipliers of the stages of the feedback circuit of FIG. 3, collectively comprise the multipliers 580. The output of the multipliers 580 are added together by an adder 590 that is also a part of the feedback circuit of the modulator 500 and the result of the addition is provided to the loop filter 510, which is analogous to the loop filter 210, as the FB 503.

Each stage (531, 532, 533, . . . ) of the feedback circuit 530 is analogous to the feedback circuit 230/330, and each stage is chopped by the combination of clk_sq[n] and OUT[n] where n=1~m. The polarities of the outputs of the feedback circuit 530 are then determined by "OUT[m:1]", which causes self-multiplication of "OUT" to remove quantization noise down-conversion. The weighted-sum of all the outputs by multipliers 580 and adder 590 produces signal FB 503.

Figure 3A:
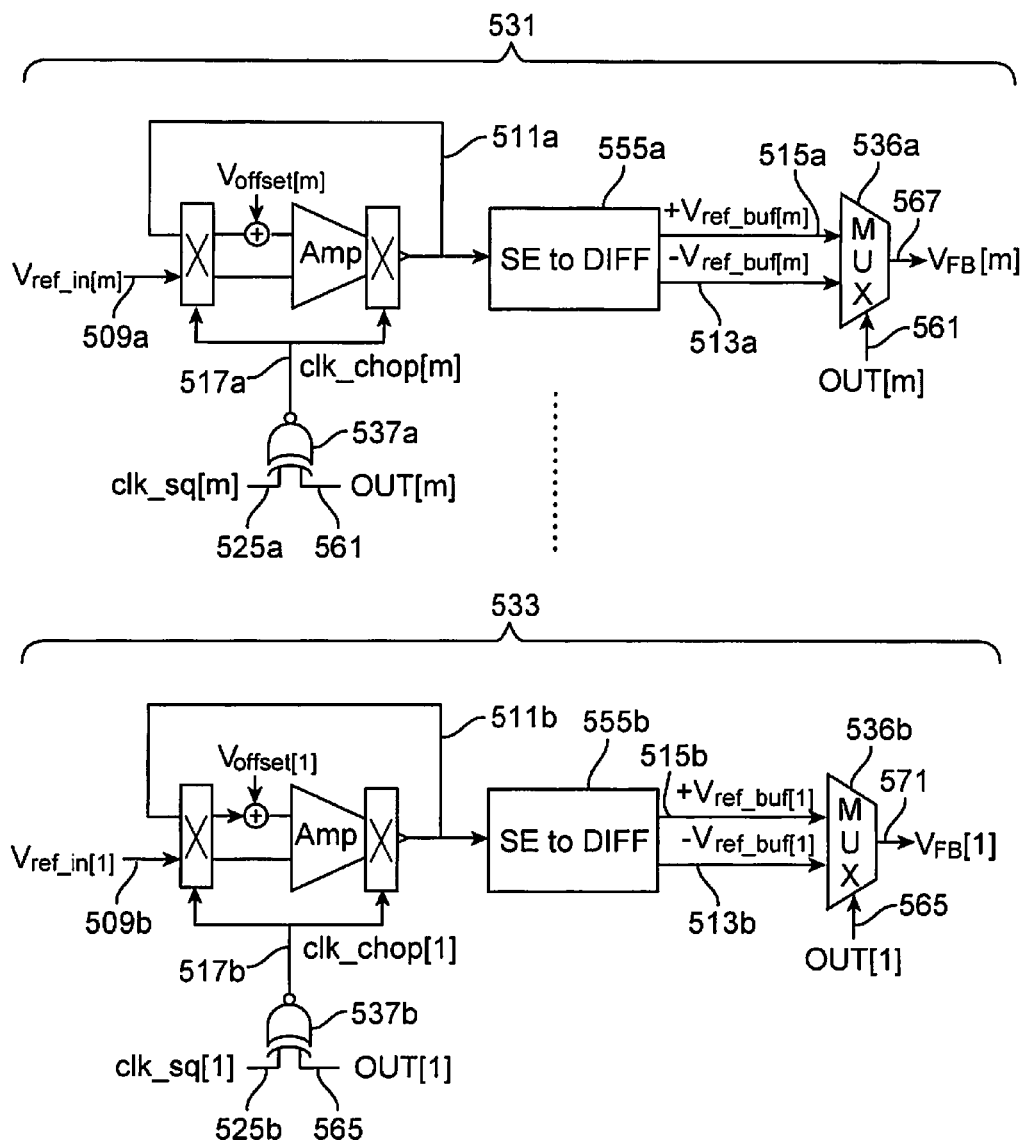
FIG. 3(a) shows further details of each of the feedback circuits 531 and 533.

For example, FIG. 3(a) shows further details of each of the feedback circuits 531 and 533 of the feedback circuit 530 of FIG. 3 in the case where the feedback circuits are analogous to 230 of FIG. 1(a).

In some embodiments, the reference buffers of the feedback circuit 530 are distinct from one another and in other embodiments, they are the same. Also, in some embodiments, in addition to conducting parallel operation of the multi-bit quantizer outputs, such as in the various stages of FIG. 3, to generate the FB 503, this may instead be done in a serial fashion using the chopping method and apparatus of the invention. Also, as indicated above, the FB 503, similar to the FB 203/303, along with other signals previously indicated, need not be a voltage and can instead be generated current, charge, etc.

Figure 4:
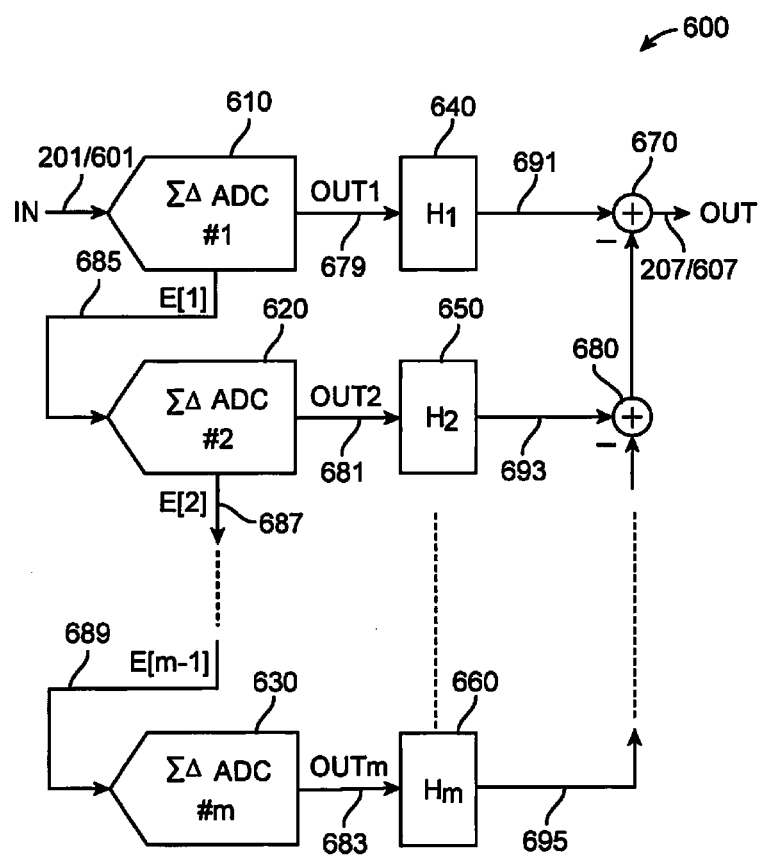
FIG. 4 shows an analog to digital converter 600, in accordance with another embodiment of the invention.

FIG. 4 shows an analog to digital converter 600, in accordance with another embodiment of the invention. The converter 600 is shown to include a multi-stage (MASH) sigma-delta modulator, made of single-loop sigma-delta modulators and filters, with analog input signal, IN 601, which is analogous to IN 201, and multi-bit digital output, OUT 607, which is analogous to OUT 207. The converter 600 includes the single-loop sigma-delta modulators 610, 620, 630, and so on, filters 640, 650, 660, and so on, with each filter having a transfer functions $H_1$, $H_2$ . . . $H_m$, respectively, and adders 670 and 680, and so on. Since the single-loop sigma-delta modulators 610, 620, 630 can adopt any of the reference buffer of the various embodiments of the invention, they advantageously avoid quantization noise down-conversion into their respective outputs, i.e. OUT1 679, OUT2 681, . . . , OUTm 683. And because the MASH sigma-delta modulator output OUT is a linear combination of OUT1, OUT2, . . . , OUTm through the filters 640, 650, 660, and so on and adders 670, 680, and so on, there is no quantization noise down-converted into its desired bandwidth. Therefore, the reference buffers of the various embodiments of the invention can be applied to MASH sigma-delta modulators.

Figure 5:
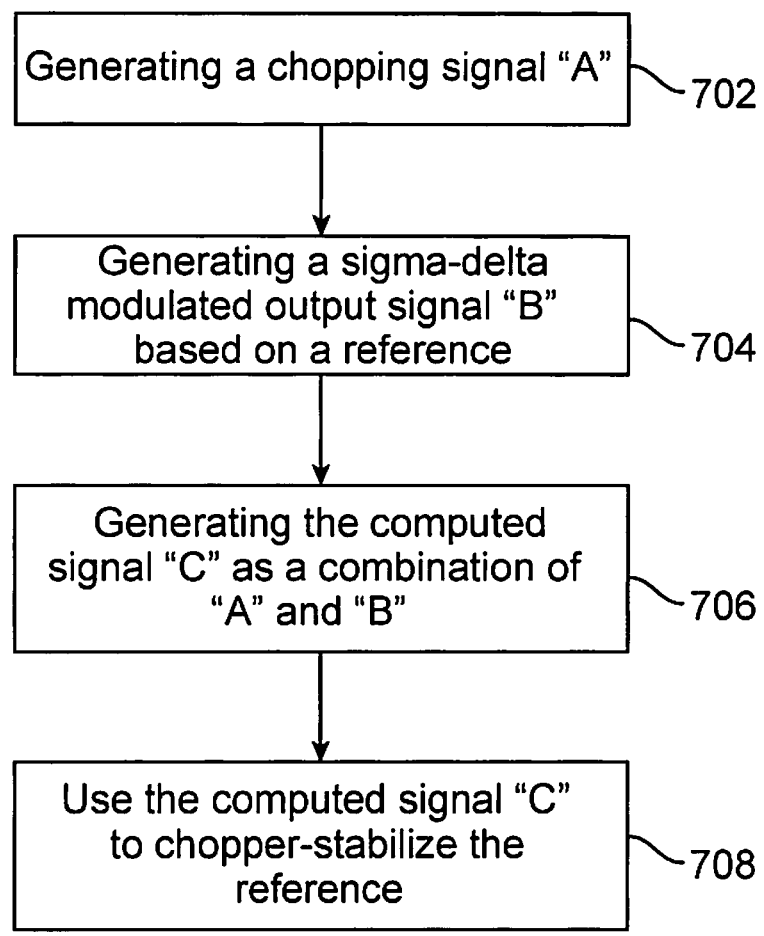
FIG. 5 shows a flow chart of the steps utilized to effectuate a chopper-stabilized amplifier in a modulator of an analog to digital converter, such as those of the various embodiment of the invention.

FIG. 5 shows a flow chart of the steps utilized to effectuate a chopper-stabilized amplifier in a modulator of an analog to digital converter, such as those of the various embodiment of the invention. In FIG. 5, at step 702, a chopping signal "A", such as the clk_sq 225 of FIG. 1 is generated. Next, at step

704, in the case of the modulator being a sigma delta type of modulator, an output, such as OUT 207, is generated, as the signal "B" and which signal is based on a reference signal, such as the signal 211. Next, at step 706, the signal "C", such as the clk_chop 217 in FIG. 1(*a*) is generated as the combination of the signals "A" and "B" and subsequently, at step 708, the signal "C" is utilized to chopper-stabilize the reference signal.

The combination of signals "A" and "B" can be generated, for example, by multiplication, exclusive-OR, or exclusive-NOR operation, or other design choices.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. An analog to digital converter comprising:
   a sigma delta modulator responsive to an analog input signal and operable to generate a quantizer output; and
   a chopper-stabilized amplifier that provides a reference signal to the sigma delta modulator,
   wherein a combination of a chopping signal and the quantizer output stabilizes the chopper-stabilized amplifier thereby causing stabilization of the reference signal.

2. The analog to digital converter of claim 1, wherein the sigma delta modulator further includes a feedback circuit operable to generate a feedback signal, the feedback circuit including the chopper-stabilized amplifier, a multiplexer, and a single-ended to differential converter that is responsive to the reference signal and operative to generate a positive reference signal and a negative reference signal, the multiplexer being operative to selectively generate the feedback signal from the positive reference signal and the negative reference signal based on the quantizer output.

3. The analog to digital converter of claim 2, wherein the reference signal, the positive reference signal, the negative reference signal, the feedback signal, or the analog input signal is a voltage signal.

4. The analog to digital converter of claim 2, wherein the reference signal, the positive reference signal, the negative reference signal, the feedback signal, or the analog input signal is a current signal.

5. The analog to digital converter of claim 2, wherein the reference signal, the positive reference signal, the negative reference signal, the feedback signal, or the analog input signal is a charge signal.

6. The analog to digital converter of claim 1, further including a feedback circuit operative to generate a positive reference signal and a negative reference signal with the negative reference signal being a scaled version of the positive reference signal, the multiplexer being operative to selectively generate the feedback signal from the positive reference voltage and the negative reference voltage based on the quantizer output.

7. The analog to digital converter of claim 6, wherein the positive reference signal, the negative reference signal, the reference signal, the feedback signal, or the analog input signal is a voltage signal.

8. The analog to digital converter of claim 6, wherein the positive reference signal, the negative reference signal, the reference signal, the feedback signal, or the analog input signal is a current signal.

9. The analog to digital converter of claim 6, wherein the positive reference signal, the negative reference signal, the reference signal, the feedback signal, or the analog input signal is a charge signal.

10. The analog to digital converter of claim 6, wherein the difference between the positive reference signal and the negative reference signal is used to generate the feedback signal.

11. The analog to digital converter of claim 1, wherein the combination is a multiplication.

12. The analog to digital converter of claim 1, wherein the combination is an exclusive-OR.

13. The analog to digital converter of claim 1, wherein the combination is an exclusive-NOR.

14. The analog to digital converter of claim 1, wherein the quantizer output comprises multiple bits and the analog to digital converter further including more than one chopper-stabilized amplifier with each chopper-stabilized amplifier of the more than one chopper-stabilized amplifiers operable to generate a distinct reference signal, selected by a multiplexer based on a corresponding quantizer output bit, and stabilized by a signal that is a combination of a distinct chopping signal and the corresponding quantizer bit.

15. The analog to digital converter of claim 1, wherein the quantizer comprises multiple quantizers.

16. The analog to digital converter of claim 1, wherein the quantizer is a multi-bit quantizer, having multiple feedback circuits, each responsive to a corresponding bit of the quantizer output, the output of each feedback circuit being multiplied by a corresponding multiplier coefficient and the outputs of the multiplications being added together to generate the feedback signal.

17. The analog to digital converter of claim 16, wherein each feedback circuit includes a chopper-stabilized amplifier, a multiplexer, and a single-ended to differential converter that is responsive to the reference signal and operative to generate a positive reference signal and a negative reference signal, the multiplexer of each feedback circuit being operative to selectively generate the feedback signal from the positive reference signal and negative reference signal based on each corresponding bit of the quantizer output.

18. The analog to digital converter of claim 17, wherein the reference signal, the positive reference signal, the negative reference signal, the feedback signal, or the analog input signal is a voltage signal.

19. The analog to digital converter of claim 17, wherein the reference signal, the positive reference signal, the negative reference signal, the feedback signal, or the analog input signal is a current signal.

20. The analog to digital converter of claim 17, wherein the reference signal, the positive reference signal, the negative reference signal, the feedback signal, or the analog input signal is a charge signal.

21. The analog to digital converter of claim 16, wherein each feedback circuit is operative to generate a positive reference signal and a negative reference signal with the negative reference signal being a scaled version of the positive reference signal, each feedback circuit further comprising a multiplexer operative to selectively generate a feedback signal from the positive reference signal and the negative reference signal of its corresponding stage based on each corresponding bit of the quantizer output.

22. The analog to digital converter of claim 21, wherein the positive reference signal, the negative reference signal, the feedback signal, or the analog input signal of each of the multiple stages is a voltage signal.

23. The analog to digital converter of claim 21, wherein the positive reference signal, the negative reference signal, the feedback signal, or the analog input signal of each of the multiple stages is a current signal.

24. The analog to digital converter of claim 21, wherein the positive reference signal, the negative reference signal, the feedback signal, or the analog input signal of each of the multiple stages is a charge signal.

25. The analog to digital converter of claim 21, wherein the difference between the positive reference signal and the negative reference signal of each of the multiple stages is used to generate the feedback signal.

26. The analog to digital converter of claim 1, further comprising at least two sigma delta modulators and at least two chopper-stabilized amplifiers.

27. The analog to digital converter of claim 1, wherein the chopping signal is a square wave.

28. The analog to digital converter of claim 1, wherein the chopping signal is a pseudo-random sequence.

29. The analog to digital converter of claim 1, wherein the chopping signal is a noise-shaped sequence.

30. The analog to digital converter of claim 1, wherein the sigma delta modulator includes a quantizer, the quantizer being responsive to the analog input signal and a feedback signal, the feedback signal being generated from the quantizer output.

31. A method of chopper stabilization comprising the steps of:
generating a reference signal by a chopper-stabilized amplifier;
generating a feedback signal based on a reference signal;
generating a quantizer output based on the feedback signal and an analog input signal;
combining a chopping signal and the quantizer output to stabilize the chopper-stabilized amplifier thereby causing stabilization of the reference signal.

32. The method of chopper stabilization of claim 31, wherein the combining step includes multiplying the chopping signal by the quantizer signal.

33. The method of chopper stabilization of claim 31, wherein the combining step includes conducting exclusive-OR operation on the chopping signal and the quantizer signal.

34. The method of chopper stabilization of claim 31, wherein the combining step includes conducting exclusive-NOR operation on the chopping signal and the quantizer signal.

35. The method of chopper stabilization of claim 31, wherein the chopping signal is a square wave.

36. The method of chopper stabilization of claim 31, wherein the chopping signal is a pseudo-random sequence.

37. The method of chopper stabilization of claim 31, wherein the chopping signal is a noise-shaped sequence.

* * * * *